(12) United States Patent
Jung et al.

(10) Patent No.: US 10,256,429 B2
(45) Date of Patent: Apr. 9, 2019

(54) DRIVING THIN-FILM TRANSISTOR AND ORGANIC LIGHT-EMITTING DISPLAY DEVICE USING THE SAME

(71) Applicant: LG DISPLAY CO., LTD., Seoul (KR)

(72) Inventors: In-Sang Jung, Paju-si (KR); Kum-Mi Oh, Seoul (KR); Won-Sang Ryu, Goyang-si (KR); Sun-Wook Ko, Yongin-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/859,017

(22) Filed: Dec. 29, 2017

(65) Prior Publication Data

US 2018/0190931 A1   Jul. 5, 2018

(30) Foreign Application Priority Data

Dec. 30, 2016   (KR) ........................ 10-2016-0184398

(51) Int. Cl.
| | |
|---|---|
| *H01L 27/32* | (2006.01) |
| *H01L 51/52* | (2006.01) |
| *G09G 3/3225* | (2016.01) |
| *H01L 29/786* | (2006.01) |

(52) U.S. Cl.
CPC ....... *H01L 51/5203* (2013.01); *G09G 3/3225* (2013.01); *H01L 27/3209* (2013.01); *H01L 27/3248* (2013.01); *H01L 27/3262* (2013.01); *H01L 27/3276* (2013.01); *H01L 29/786* (2013.01); *G09G 2310/0264* (2013.01)

(58) Field of Classification Search
CPC ............ H01L 51/5203; H01L 27/3276; H01L 27/3262; H01L 27/3248; H01L 29/786; G09G 3/3225
See application file for complete search history.

*Primary Examiner* — Charles V Hicks
(74) *Attorney, Agent, or Firm* — Birch, Stewart, Kolasch & Birch, LLP

(57) ABSTRACT

A driving thin-film transistor can include a substrate; a first active layer disposed on the substrate and including a first protruding portion; a second active layer overlapping with the first active layer and including a second protruding portion; a gate electrode disposed between the first active layer and the second active layer; a source electrode connected to the first protruding portion of the first active layer; and a drain electrode connected to the second protruding portion of the second active layer, in which the first protruding portion of the first active layer and the second protruding portion of the second active layer are located at different positions.

20 Claims, 11 Drawing Sheets

DRIVING THIN-FILM TRANSISTOR AND ORGANIC LIGHT-EMITTING DISPLAY DEVICE USING THE SAME

This application claims the benefit of Korean Patent Application No. 10-2016-0184398, filed in the Republic of Korea on Dec. 30, 2016, which is hereby incorporated by reference as if fully set forth herein.

BACKGROUND OF THE INVENTION

Field of the Invention

The present invention relates to a driving thin-film transistor, and more particularly, to a stack-type driving thin-film transistor, which is advantageous for super-high resolution and secures device stability, and an organic light-emitting display device using the same.

Discussion of the Related Art

With the development of various portable electronic apparatuses, such as mobile communication terminals and laptop computers, there is an increasing demand for flat panel display devices that may be applied thereto.

As such flat panel display devices, for example, liquid crystal display devices, plasma display panel devices, field emission display devices, and organic or inorganic light-emitting display devices have been studied. Among these flat panel display devices, in particular, the application of an organic light-emitting display device is increasing owing to several advantages thereof, such as development of mass-production technology, ease of driving means, low power consumption, high image quality, ease of realization of a large screen, and flexibility thereof.

In addition, such a flat panel display device includes a plurality of pixels in a matrix, and one or more thin-film transistors (TFTs) capable of individually controlling each pixel are provided in the pixel. In addition, each pixel may include an R-sub-pixel, a G-sub-pixel, and a B-sub-pixel for color expression.

However, since a display device for augmented reality or virtual reality needs to realize high resolution within a limited size, the size of individual sub-pixels is gradually being reduced. In addition, in an organic light-emitting display device in which a light-emitting element is provided in each sub-pixel, at least two thin-film transistors and one capacitor (2T1C) should to be provided in the sub-pixel having a reduced size in order to allow the individual sub-pixels to be selectively driven for gradation, and in this situation, the respective thin-film transistors have the same structure. However, although element characteristics such as, for example, mobility of the respective thin-film transistors, are improved when the area of each sub-pixel is small, a driving thin-film transistor may undergo the saturation of current within a short time when a gate voltage is applied thereto, which makes it difficult to realize various and sufficient gradation.

That is, the higher the resolution, the smaller the sub-pixel, and all circuit elements required to drive each sub-pixel need to be included in the limited area of the sub-pixel. In this situation, when the driving thin-film transistor has the same stack structure as the other thin-film transistors, the speed of response of the thin-film transistors is fast, but sufficient gradation is difficult because the linear section of the $I_{DS}$-$V_G$ graph is excessively short. In addition, since a thin-film transistor having a general single gate structure exhibits a worsened kink effect, which causes increased $I_D$, after saturation, the thin-film transistor has difficulty in securing reliability as a driving thin-film transistor that directly supplies current to an organic light-emitting diode.

SUMMARY OF THE INVENTION

Accordingly, the present invention is directed to a driving thin-film transistor and an organic light-emitting display device using the same that substantially obviate one or more problems due to limitations and disadvantages of the related art.

An object of the present invention is to provide a stack-type driving thin-film transistor, which is advantageous for super-high resolution and sufficient gradation in a smaller pixel and secures reliability in the driving of an organic light-emitting diode, and an organic light-emitting display device using the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

A driving thin-film transistor and an organic light-emitting display device using the same according to the present invention include a stack-type active layer, thereby reducing a kink effect and enabling sufficient gradation and high resolution by increasing a channel length without increasing an area in plan.

To achieve these objects and other advantages and in accordance with the purpose of the invention, as embodied and broadly described herein, a driving thin-film transistor includes a first active layer and a second active layer provided in different layers over a substrate to overlap each other, the first active layer and the second active layer respectively having protruding portions at different positions, a gate electrode located between the first and second active layers, a source electrode connected to the protruding portion of the first active layer, and a drain electrode connected to the protruding portion of the second active layer.

In addition, the driving thin-film transistor may further include a connection electrode provided in a region in which the first active layer and the second active layer overlap each other and configured to penetrate the first and second active layers to be laterally connected to the first and second active layers.

In addition, the connection electrode may be laterally connected to a doped area of each of the first and second active layers.

In addition, the driving thin-film transistor may further include a first gate insulation layer between the first active layer and the gate electrode, and a second gate insulation layer between the gate electrode and the second active layer.

The gate electrode may not overlap the protruding portions of the first and second active layers.

The gate electrode may overlap the first active layer and the second active layer at different regions.

The gate electrode may have an area overlapping the first active layer, which is different in size from an area overlapping the second active layer.

In addition, the protruding portions of the first and second active layers may be doped areas.

In addition, the first active layer and the second active layer may include a first channel and a second channel, respectively, and electrons moving from the source electrode to the drain electrode may pass through the first channel, the connection electrode and the second channel.

In accordance with another aspect of the present invention, an organic light-emitting display device includes a substrate having a plurality of sub-pixels, a driving thin-film transistor provided in each sub-pixel and including a first active layer and a second active layer provided in different layers over a substrate to overlap each other, the first active layer and the second active layer respectively having protruding portions at different positions, a first gate electrode located between the first and second active layers, a first source electrode connected to the protruding portion of the first active layer, and a first drain electrode connected to the protruding portion of the second active layer, a switching thin-film transistor connected to the driving thin-film transistor in each sub-pixel and including a second gate electrode in the same layer as the first gate electrode, a second source electrode and a second drain electrode in the same layer as the first source electrode and the first drain electrode, and a third active layer located in the same layer as any one of the first active layer and the second active layer, and an organic light-emitting diode connected to the first source electrode or the first drain electrode.

It is to be understood that both the foregoing general description and the following detailed description of the present invention are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
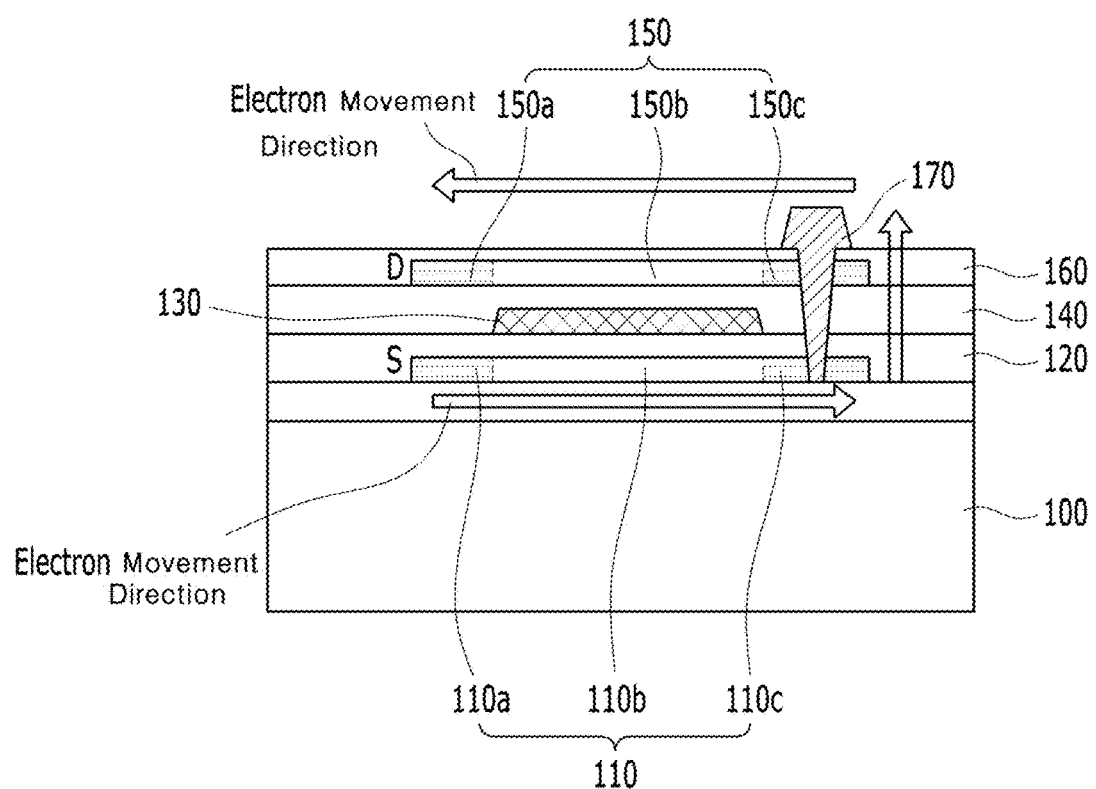
FIG. 1 is a cross-sectional view illustrating a driving thin-film transistor according to an embodiment of the present invention.

The advantages and features of the present invention and the way of attaining them will become apparent with reference to embodiments described below in detail in conjunction with the accompanying drawings. The present invention, however, is not limited to the embodiments disclosed hereinafter and may be embodied in many different forms. Rather, these example embodiments are provided so that this disclosure will be through and complete and will fully convey the scope to those skilled in the art. The scope of the present invention should be defined by the claims.

In the drawings for explaining the exemplary embodiments of the present invention, for example, the illustrated shape, size, ratio, angle, and number are given by way of example, and thus, are not limited to the disclosure of the present invention. Throughout the present specification, the same reference numerals designate the same constituent elements. In addition, in the following description of the present invention, a detailed description of known functions and configurations incorporated herein will be omitted when it may make the subject matter of the present invention rather unclear. The terms "comprises," "includes," and/or "has," used in this specification, do not preclude the presence or addition of other elements unless it is used along with the term "only." The singular forms "a," "an," and "the" are intended to include the plural forms as well, unless the context clearly indicates otherwise.

In the interpretation of constituent elements included in the various embodiments of the present invention, the constituent elements are interpreted as including an error range even if there is no explicit description thereof.

In the description of the various embodiments of the present invention, when describing positional relationships, for example, when the positional relationship between two parts is described using "on," "above," "below," "aside," or the like, one or more other parts may be located between the two parts unless the term "directly" or "closely" is used.

In the description of the various embodiments of the present invention, when describing temporal relationships, for example, when the temporal relationship between two actions is described using "after," "subsequently," "next," "before," or the like, the actions may not occur in succession unless the term "directly" or "just" is used.

In the description of the various embodiments of the present invention, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present invention unless otherwise mentioned.

The respective features of the various embodiments of the present invention may be partially or wholly coupled to and combined with each other, and various technical linkages and driving thereof are possible. These various embodiments may be performed independently of each other, or may be performed in association with each other.

FIG. 1 is a cross-sectional view illustrating a driving thin-film transistor according to an embodiment of the present invention.

Figure 2:
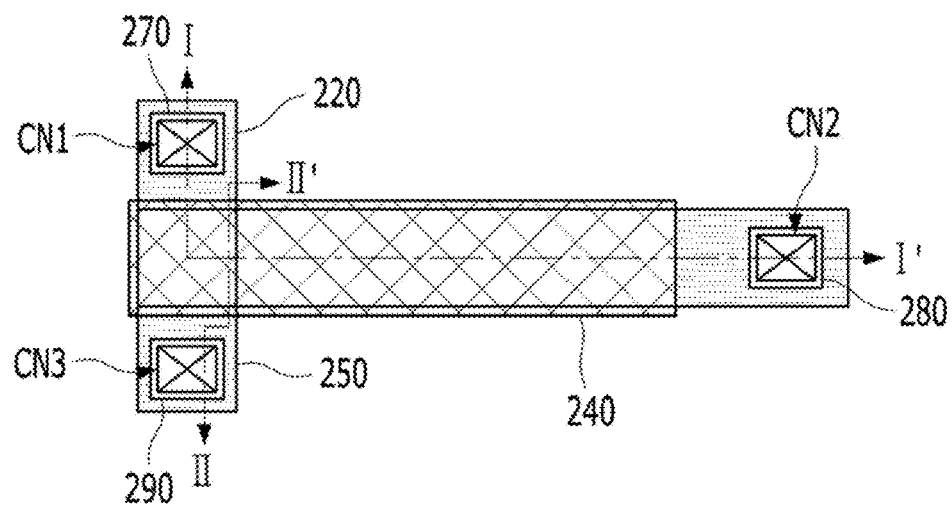
FIG. 2 is a plan view illustrating a driving thin-film transistor according to an embodiment of the present invention.
Figure 3A:
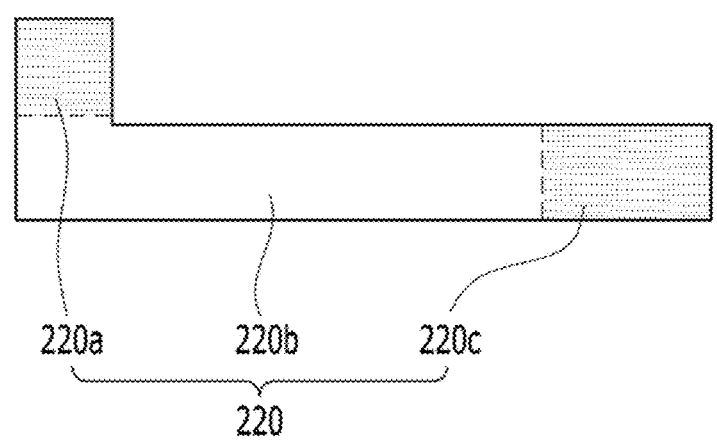
FIG. 3A is a plan view illustrating a first active layer of FIG. 2.
Figure 3B:
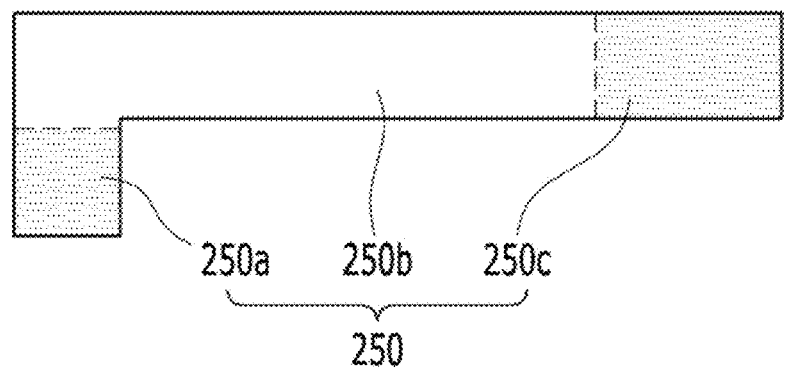
FIG. 3B is a plan view illustrating a second active layer of FIG. 2.

As illustrated in FIG. 1, the driving thin-film transistor of the present invention includes a first active layer 110 and a second active layer 150, which are disposed on different layers over a substrate 100 to overlap each other and respectively have protruding portions at different positions (in the cross-sectional view, the protruding portions would be located to penetrate the sheet of FIG. 1 in regions designated by S and D, respectively, see FIGS. 2-3B), and a gate electrode 130 located between the first and second active layers 110 and 150.

That is, the first and second active layers 110 and 150 can be stacked one above another in order to halve the footprint required for the channel area of the driving thin-film transistor.

In addition, the first and second active layers 110 and 150, which are provided in different layers, are connected to each other via a connection electrode 170, which penetrates and interconnects the two layers.

Accordingly, considering the flow of electrons in the first and second active layers 110 and 150, electrons sequentially pass through a source (S) area 110a, a first channel 110b, and a connection area 110c of the first active layer 110, the connection electrode 170, and a connection area 150c, a second channel 150b and a drain (D) area 150a of the second active layer 150.

This means that electrons do not move in a single layer, but move in two layers through the connection electrode 170, which may result in an increased channel length (including both the channels 110b and 150b). In addition, the driving thin-film transistor advantageously realizes various gradations owing to an extended linear section of the I-V graph in which $I_{Ds}$ is linearly increased compared to $V_{Gs}$.

Here, the first active layer 110 includes two doped areas, one of which functions as the source area 110a and the other one of which functions as the connection area 110c.

The second active layer 150 includes two doped areas, one of which functions as the connection area 150c located to overlap the connection area 110c of the first active layer 110 and the other one of which functions as the drain area 150a. Here, the drain area 150a of the second active layer 150 and the source area 110a of the first active layer 110 may respectively have portions that do not overlap each other and may be connected at the non-overlapping portions thereof to a source electrode and a drain electrode, respectively.

Here, the driving thin-film transistor includes a source electrode (see FIGS. 2 to 9), which is connected to the source area 110a of the first active layer 110, more particularly, the protruding portion of the first active layer 110, and a drain electrode (see FIGS. 2 to 9), which is connected to the drain area 150a of the second active layer 150, more particularly, the protruding portion of the second active layer 150. The driving thin-film transistor is connected to signal lines, which pass through a corresponding sub-pixel, via the source electrode and the drain electrode.

Considering the insulation layers illustrated in FIG. 1 from the bottom in sequence, a buffer layer 105 is provided between the substrate 100 and the first active layer 110, a first gate insulation layer 120 is provided between the first active layer 110 and the gate electrode 130, a second gate insulation layer 140 is provided between the gate electrode 130 and the second active layer 150, and an interlayer insulation layer 160 is provided to cover the second active layer 150.

In FIG. 1, the connection electrode 170 has a flat portion on the interlayer insulation layer 160 (e.g., a nail shape). Alternatively, the flat portion of the connection electrode 170 may be directly connected to the surface of the connection area 150c of the second active layer 150. In addition, the connection electrode 170 is provided to penetrate each of the second active layer 150 and the first active layer 110, in order to connect the connection electrode 170, the source electrode and the drain electrode to both the first and second active layers 110 and 150 using a single mask. The doped areas of the respective active layers are laterally connected to the respective electrodes in the perforated region through which the connection electrode 170 penetrates.

Hereinafter, concrete examples of the driving thin-film transistor of the present invention will be described with reference to embodiments.

First Embodiment

Figure 4:
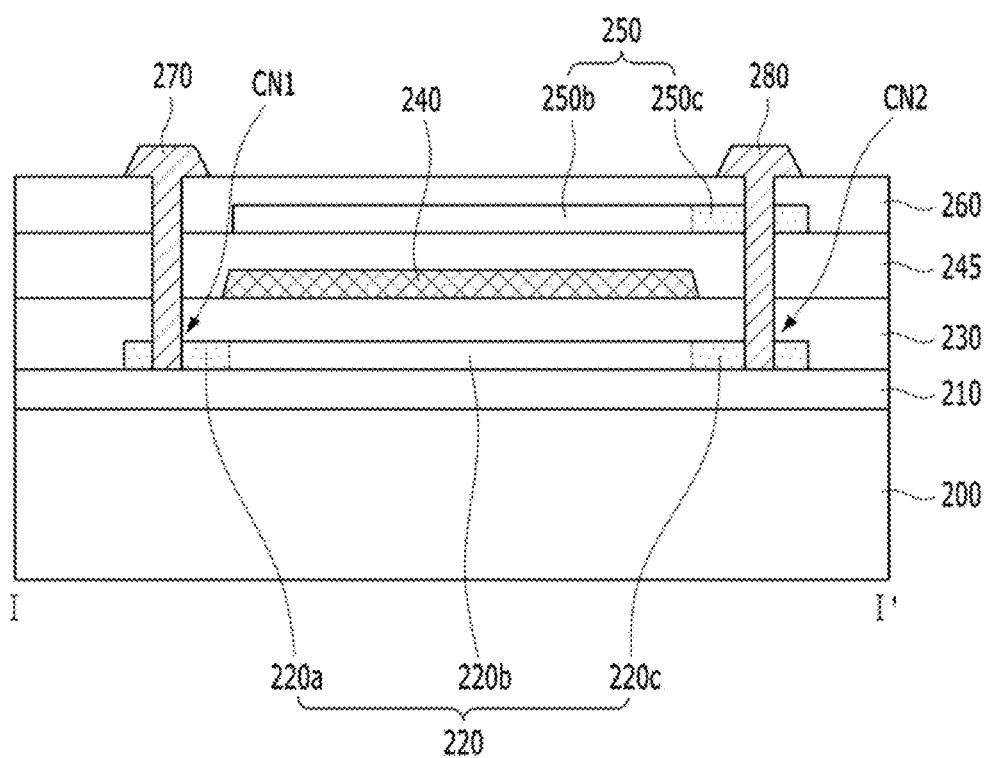
FIG. 4 is a cross-sectional view taken along line I-I' of FIG. 2.
Figure 5:
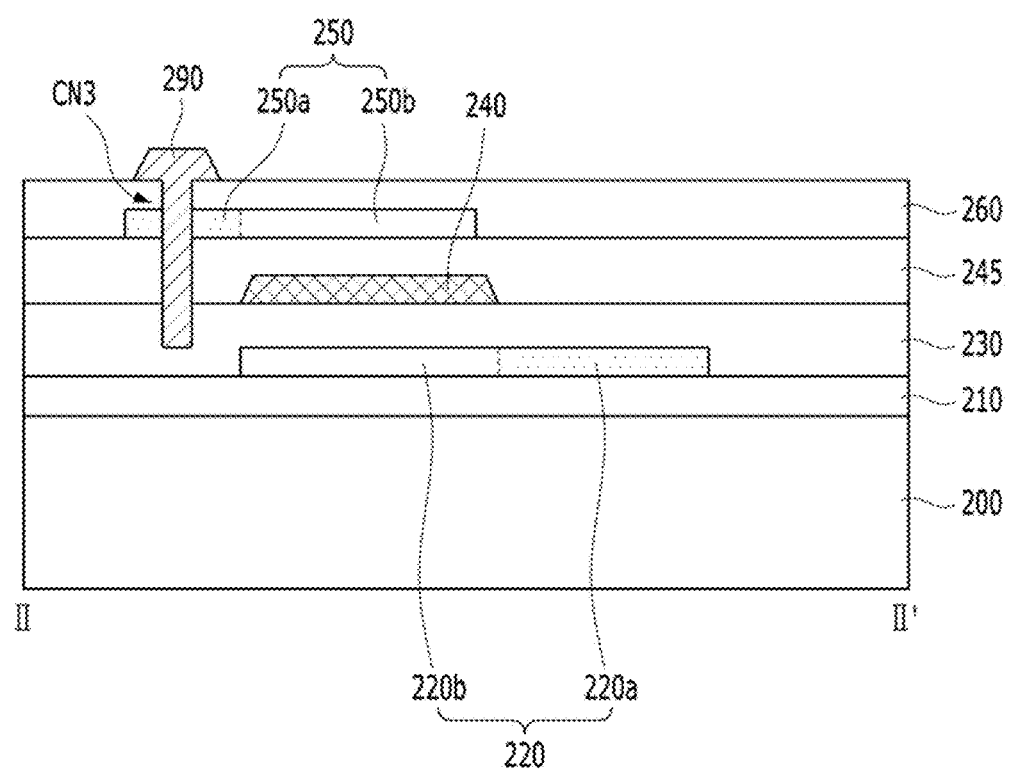
FIG. 5 is a cross-sectional view taken along line II-II' of FIG. 2.

FIG. 2 is a plan view illustrating a driving thin-film transistor according to a first embodiment of the present invention, FIG. 3A is a plan view illustrating a first active layer of FIG. 2, and FIG. 3B is a plan view illustrating a second active layer of FIG. 2. In addition, FIG. 4 is a cross-sectional view taken along line I-I' of FIG. 2 and FIG. 5 is a cross-sectional view taken along line II-II' of FIG. 2.

In the plan structure of the driving thin-film transistor according to the first embodiment of the present invention, as illustrated in FIGS. 2 to 5, channels 220b and 250b of first and second active layers 220 and 250 have the same area. The first and second active layers 220 and 250 have protruding portions configured to be connected to different electrodes (e.g., a source electrode 270 and a drain electrode 290), and the protruding portions are doped.

Now, the layered structure of the driving thin-film transistor will be described in sequence starting with a substrate 200. A buffer layer 210 is provided on the substrate 200, the first active layer 220 is provided on the buffer layer 210, a first gate insulation layer 230 is provided to cover the first active layer 220, a gate electrode 240 is provided on the first gate insulation layer 230 to overlap a portion of the first active layer 220, a second gate insulation layer 245 is provided to cover the gate electrode 240, the second active layer 250 is provided on the second gate insulation layer 245 to overlap the gate electrode 240 in the same region as that in which the gate electrode 240 overlaps the first active layer 220, and an interlayer insulation layer 260 is provided to cover the second active layer 250. The driving thin-film transistor further includes the source electrode 270, which is connected to the first active layer 220 via a first contact hole CN1, a connection electrode 280, which is connected to the first and second active layers 220 and 250 via a second contact hole CN2, and the drain electrode 290, which is connected to the second active layer 250 via a third contact hole CN3.

In addition, specifically, as illustrated in FIG. 3A, the first active layer 220 includes a first channel 220b in the center thereof and doped areas 220a and 220c at opposite sides thereof. The doped area 220a at one side is connected to the source electrode 270, and the doped area 220c at the other side is connected to the connection electrode 280.

In addition, as illustrated in FIG. 3B, the second active layer 250 includes a second channel 250b in the center thereof and doped areas 250a and 250c at opposite sides thereof. The doped area 250a at one side is connected to the drain electrode 290, and the doped area 250c at the other side is connected to the connection electrode 280.

The driving thin-film transistor according to the first embodiment of the present invention includes the gate electrode 240 between the first and second active layers 220 and 250.

The contact holes CN1, CN2 and CN3 are defined by removing the interlayer insulation layer 260, the second active layer 250, the second gate insulation layer 245 and the first gate insulation layer 230. The source electrode 270, the drain electrode 290, and the connection electrode 280 respectively have flat portions on the surface of the interlayer insulation layer 260, and penetrate the insulation layers and the active layers thereunder through the first to third contact holes CN1, CN2 and CN3 to be laterally connected to the active layers in the overlapping regions.

Here, as illustrated in FIG. 4, the first contact hole CN1 is the region in which the source electrode 270 and the doped area 220a of the first active layer 220 are connected to each other and is defined by vertically removing the interlayer insulation layer 260, the second gate insulation layer 245, the first gate insulation layer 230 and the first active layer 220.

In addition, the second contact hole CN2 is the region in which the connection electrode 280 and the doped areas 220c and 250c of the first and second active layers 220 and 250 are connected to each other and is defined by vertically removing the interlayer insulation layer 260, the second active layer 250, the second gate insulation layer 245, the first gate insulation layer 230 and the first active layer 220.

In addition, as illustrated in FIG. 5, the third contact hole CN3 is the region in which the drain electrode 290 and the doped area 250a of the second active layer 250 are connected to each other and is defined by vertically removing the interlayer insulation layer 260, the second active layer 250, the second gate insulation layer 245, and a portion of the first gate insulation layer 230.

In an embodiment of the present invention, the electrodes penetrate the active layers and are laterally connected thereto, in order to reduce the number of masks. That is, in order to connect the first active layer 220 and the second active layer 250, which are located in different layers, to a metal, which is formed via single patterning, through the contact holes CN1, CN2 and CN3, which are defined together in a single contact-hole forming process before the patterning, the contact holes CN1, CN2 and CN3 are formed via over-etching to the first active layer 220, which is a lower active layer. In addition, in this situation, since the etching is performed to ensure that the electrodes are connected to the first active layer 220 and an etchant used to form the contact holes includes a component that reacts with the active layer, the overlapping portions of the active layers 220 and 250 and the insulation layers between the first and second active layers 220 and 250 may be removed in the region in which the first and second active layers 220 and 250 overlap each other.

In this process, the connection electrode 280 penetrates both the first and second active layers 220 and 250 in the overlapping portions of the first and second active layers 220 and 250, e.g., in the second contact hole CN2, and is laterally connected to the first and second active layers 220 and 250. In addition, each of the source electrode 270 and the drain electrode 290 penetrates the first active layer 220 or the second active layer 250 and is laterally connected to the first active layer 220 or the second active layer 250.

Although FIG. 5 illustrates the third contact hole CN3 as being formed to the fraction of the thickness of the first gate insulation layer 230, in some situations, the entire thickness of the second gate insulation layer 230 may be removed in the region of the third contact hole CN3.

Here, according to an embodiment, the protruding portions (e.g., the areas 220a and 250a) of the first and second active layers 220 and 250 should be located respectively in different areas in a plane, in order to be connected to the source electrode 270 and the drain electrode 290. In addition, these protruding portions (e.g., the areas 220a and 250a) should not overlap the gate electrode 240. The gate electrode 240 is located between the first and second active layers 220 and 250 and the source electrode 270 and the drain electrode 290 are located in the same layer above the gate electrode 240. As such, the protruding portions (e.g., the areas 220a and 250a) serve to prevent short-circuit between an electrode material, which penetrates and is connected to the first active layer 220 and the second active layer 250, and the gate electrode 240.

In addition, the first and second active layers 220 and 250 of the present invention are formed of poly-silicon, which is acquired by depositing amorphous silicon and crystallizing the same via laser irradiation. The doped areas 220a, 220c, 250a and 250c, which are formed using the same dopant, are connected to the respective electrodes with low resistance. In addition, undoped intrinsic areas of the first and second active layers 220 and 250 function as the first and second channels 220b and 250b.

The driving thin-film transistor according to the first embodiment of the present invention includes dual channels so that the entire channel length becomes double that of a single stack. As such, it is possible to prevent an increase in drain current $I_{DS}$, which occurs when a voltage value is continuously increased after the drain current $I_{Ds}$ is supplied until saturation, which may prevent a kink effect and may stabilize the current to be supplied to an organic light-emitting diode.

In addition, in the driving thin-film transistor according to the first embodiment of the present invention, the area of the gate electrode is reduced by half compared to that of a dual gate structure in which two gate electrodes are spaced apart from each other in a plane. This driving thin-film transistor is suitable for a super-high resolution structure having a smaller sub-pixel area.

In addition, when the driving thin-film transistor described above is applied to an organic light-emitting display device, the doped area of the active layer and the metal that overlaps the doped area may be used as a storage electrode so that the doped area has a double-layered structure. This ensures ease of acquisition of storage capacity.

In addition, the buffer layer 210 serves to prevent any foreign substance or gas included in the substrate 200 from having an effect on the first and second active layers 220 and 250 due to heat applied during the crystallization of the first and second active layers 220 and 250. The buffer layer 210 may adopt a different material or a different etching rate from that of the insulation layer thereabove, in order to remain without variation in the layered structure upon the formation of the contact holes described above.

Second Embodiment

Figure 6:
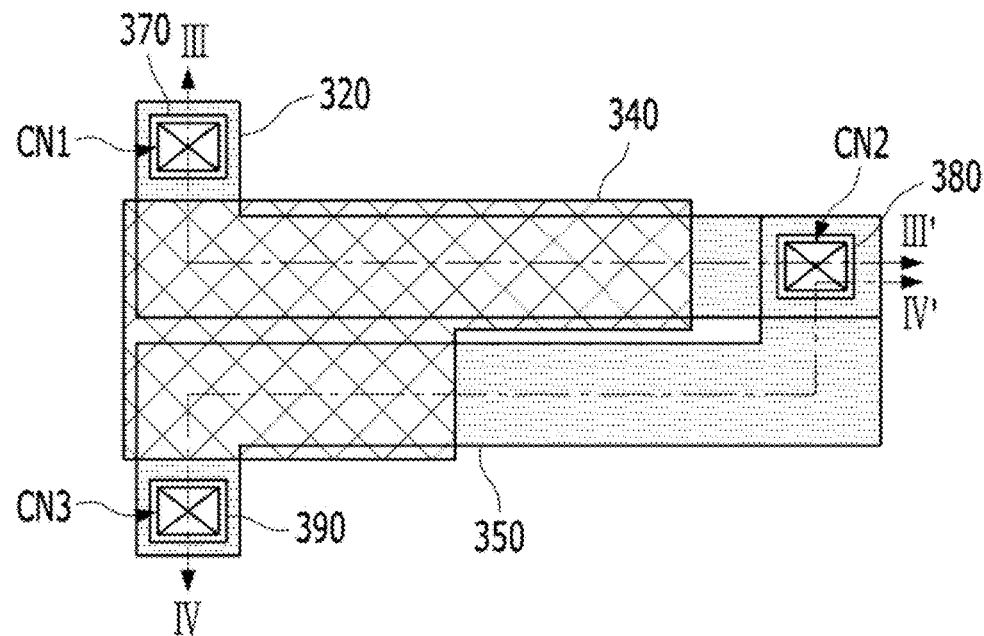
FIG. 6 is a plan view illustrating a driving thin-film transistor according to an embodiment of the present invention.
Figure 7A:
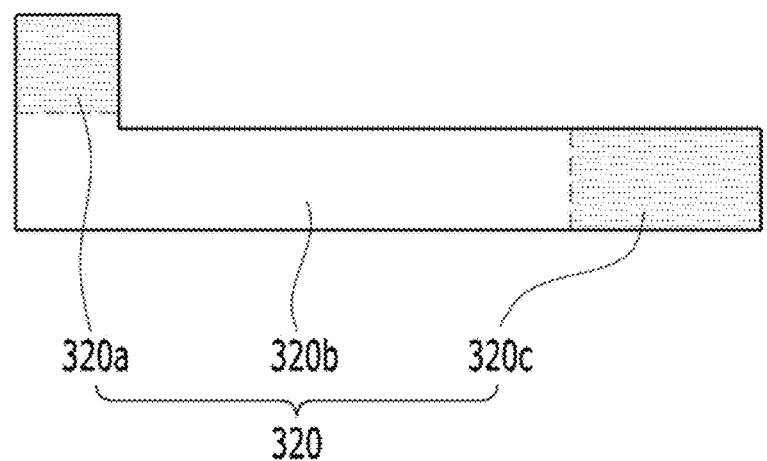
FIG. 7A is a plan view illustrating a first active layer of FIG. 6.
Figure 7B:
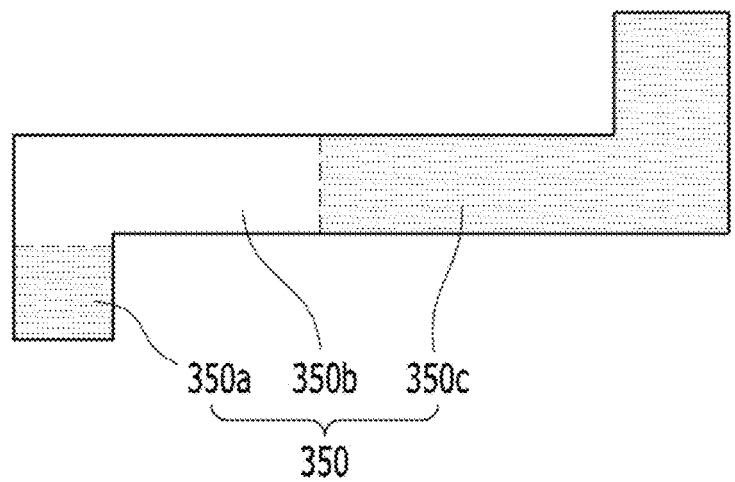
FIG. 7B is a plan view illustrating a second active layer of FIG. 6.
Figure 8:
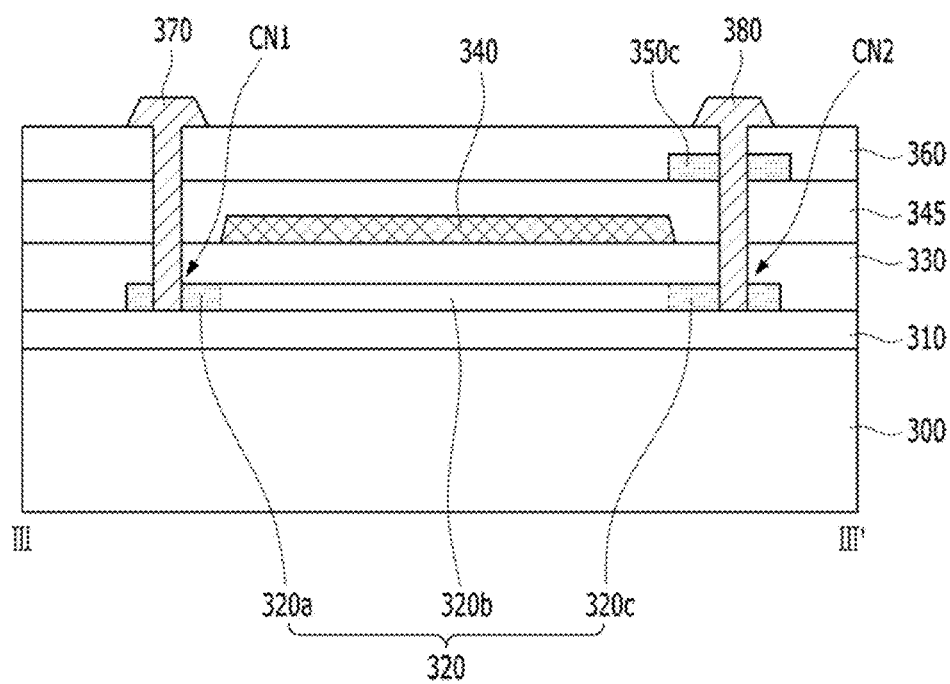
FIG. 8 is a cross-sectional view taken along line of FIG. 6.
Figure 9:
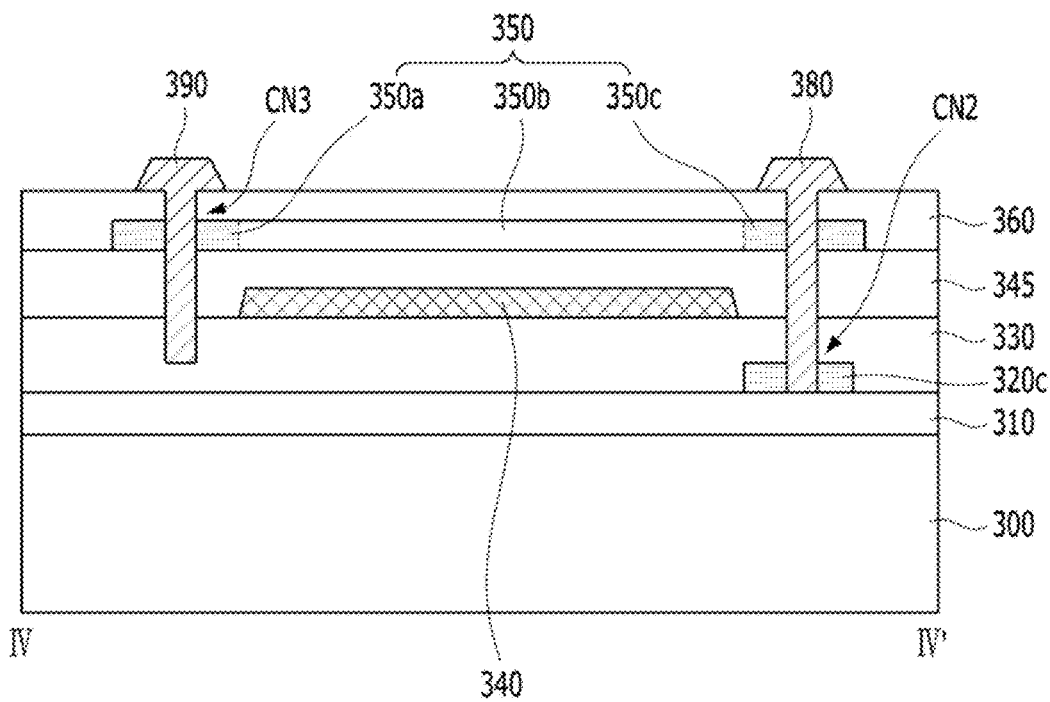
FIG. 9 is a cross-sectional view taken along line IV-IV' of FIG. 6.

FIG. 6 is a plan view illustrating a driving thin-film transistor according to a second embodiment of the present invention, FIG. 7A is a plan view illustrating a first active layer of FIG. 6, and FIG. 7B is a plan view illustrating a second active layer of FIG. 6. In addition, FIG. 8 is a cross-sectional view taken along line of FIG. 6, and FIG. 9 is a cross-sectional view taken along line IV-IV' of FIG. 6.

The driving thin-film transistor according to the second embodiment of the present invention illustrated in FIGS. 6 to 9 has the same layered structure as that of the driving thin-film transistor according to the first embodiment of the present invention described above, but differs as to the area over which a gate electrode 340 overlaps first and second active layers 320 and 350, and consequently, differs as to the length of channels provided in the first and second active layers 320 and 350.

Now, a layered structure of the driving thin-film transistor will be described from a substrate 300 in sequence. A buffer layer 310 is provided on the substrate 300, the first active layer 320 is provided on the buffer layer 310, a first gate insulation layer 330 is provided to cover the first active layer 320, a gate electrode 340 is provided on the first gate insulation layer 330 to overlap a portion of the first active layer 320, a second gate insulation layer 345 is provided to cover the gate electrode 340, the second active layer 350 is provided on the second gate insulation layer 345 to overlap the gate electrode 340 in a region different from the region in which the gate electrode 340 overlaps the first active layer 320, and an interlayer insulation layer 360 is provided to cover the second active layer 350. The driving thin-film transistor further includes a source electrode 370 connected to the first active layer 320 via a first contact hole CN1, a connection electrode 380 connected to the first and second active layers 320 and 350 via a second contact hole CN2, and a drain electrode 390 connected to the second active layer 350 via a third contact hole CN3.

Here, the gate electrode 340 overlaps the first active layer 320 by a first length and overlaps the second active layer 350 by a second length, which is shorter than the first length. In order to attain different channel lengths, the first and second active layers 320 and 350 are located in different regions excluding connection areas 320c and 350c.

Specifically, as illustrated in FIG. 7A, the first active layer 320 includes a first channel 320b in the center thereof and doped areas 320a and 320c at opposite sides thereof. The doped area 320a at one side is connected to the source electrode 370, and the doped area 320c at the other side is connected to the connection electrode 380.

In addition, as illustrated in FIG. 7B, the second active layer 350 includes a second channel 350b in the center thereof and doped areas 350a and 350c at opposite sides thereof. The doped area 350a at one side is connected to the drain electrode 390, and the doped area 350c at the other side is connected to the connection electrode 380.

The driving thin-film transistor according to the second embodiment of the present invention includes the gate electrode 340 between the first and second active layers 320 and 350.

The contact holes CN1, CN2 and CN3 are defined by removing the interlayer insulation layer 360, the second active layer 350, the second gate insulation layer 345 and the first gate insulation layer 330. The source electrode 370, the drain electrode 390, and the connection electrode 380 respectively have flat portions on the surface of the interlayer insulation layer 360, and penetrate the insulation layers and the active layers thereunder through the first to third contact holes CN1, CN2 and CN3 to be laterally connected to the active layers in the overlapping regions.

Here, as illustrated in FIG. 8, the first contact hole CN1 is the region in which the source electrode 370 and the doped area 320a of the first active layer 320 are connected to each other and is defined by vertically removing the interlayer insulation layer 360, the second gate insulation layer 345, the first gate insulation layer 330 and the first active layer 320.

In addition, the second contact hole CN2 is the region in which the connection electrode 380 and the doped areas 320c and 350c of the first and second active layers 320 and 350 are connected to each other and is defined by vertically removing the interlayer insulation layer 360, the second active layer 350, the second gate insulation layer 345, the first gate insulation layer 330 and the first active layer 320.

In addition, as illustrated in FIG. 9, the third contact hole CN3 is the region in which the drain electrode 390 and the doped area 350a of the second active layer 350 are connected to each other and is defined by vertically removing the interlayer insulation layer 360, the second active layer 350, the second gate insulation layer 345, and a portion of the first gate insulation layer 330.

The connection between the active layers and the source electrode, the drain electrode and the connection electrode is the same as that in the first embodiment described above, and thus, a description thereof will be omitted.

In addition, the first and second active layers 320 and 350 of the present invention are formed of poly-silicon, which is acquired by depositing amorphous silicon and crystallizing the same via laser irradiation. The doped areas 320a, 320c, 350a and 350c, which are formed using the same dopant, are connected to the respective electrodes with low resistance. In addition, undoped intrinsic areas of the first and second active layers 320 and 350 function as the first and second channels 320b and 350b.

In some situations, as described above, when the first and second active layers 320 and 350 overlap each other only in given portions thereof and the overlapping portions are used only for connection with the electrodes, the laser crystallization for the first and second active layers 320 and 350 may not be performed for each layer, but may be performed once.

In addition, the driving thin-film transistor according to the second embodiment of the present invention may entail an increase in the area occupied by the active layers, compared to the driving thin-film transistor according to the first embodiment, since the channels of the active layers are located so as not to overlap each other. However, even in this situation, since the first and second active layers 320 and 350 are located in different layers, the first and second active layers 320 and 350 may be located to overlap each other and may have no space therebetween, which ensures ease of integration in a small area and is advantageous for realizing high-resolution.

Hereinafter, the characteristics of the driving thin-film transistor having the structure of the present invention will be described.

Figure 10:
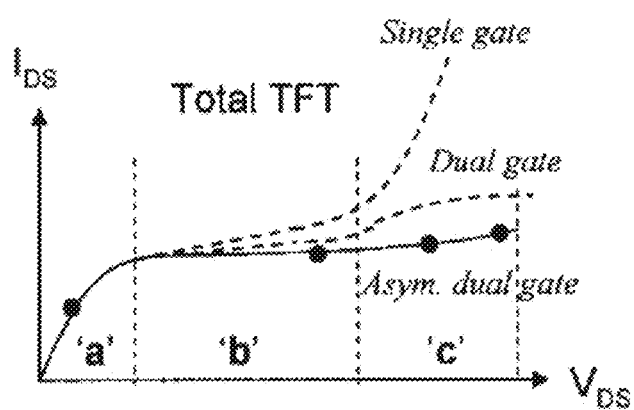
FIG. 10 is a graph illustrating $I_{Ds}$-$V_{Ds}$ characteristics when the thin-film transistors respectively include a single gate, symmetrical dual gates and asymmetrical dual gates.

FIG. 10 is a graph illustrating $I_{Ds}$-$V_{Ds}$ characteristics when the thin-film transistors respectively include a single gate, symmetrical dual gates and asymmetrical dual gates.

FIG. 10 illustrates the kink effect of the respective structures. The kink effect refers to a phenomenon in which, which a gradually increasing voltage $V_{Ds}$ is applied after saturation of current $I_{Ds}$, the current $I_{Ds}$ does not remain saturated, but is increased.

It can be verified from the structures of FIG. 10 that the kink effect is intense in the thin-film transistor having a single gate structure, but is remarkably reduced or does not occur at all in the thin-film transistors having a symmetrical dual gate structure or an asymmetrical dual gate structure. Accordingly, it can be expected that the kink effect may be prevented when the dual channel structure of the present invention is provided to achieve the same effect as the dual gate structure.

The driving thin-film transistor according to the first embodiment of the present invention described above exhibits the same effect as that having a symmetrical dual gate structure, and the driving thin-film transistor according to the second embodiment of the present invention described above exhibits the same effect as having an asymmetrical dual gate structure, even though both embodiments use a single gate. In other words, although the embodiments of the present invention adopt the gate electrode that is formed in a single layer, a stack structure in which two active layers are stacked above and under the gate electrode exerts the same dual channel effect as the dual gate structure.

Compared to a related art dual gate structure, the stack-type driving thin-film transistor of the present invention may be advantageously applied to a small area and may be applied to a high resolution display device.

Figure 11A:
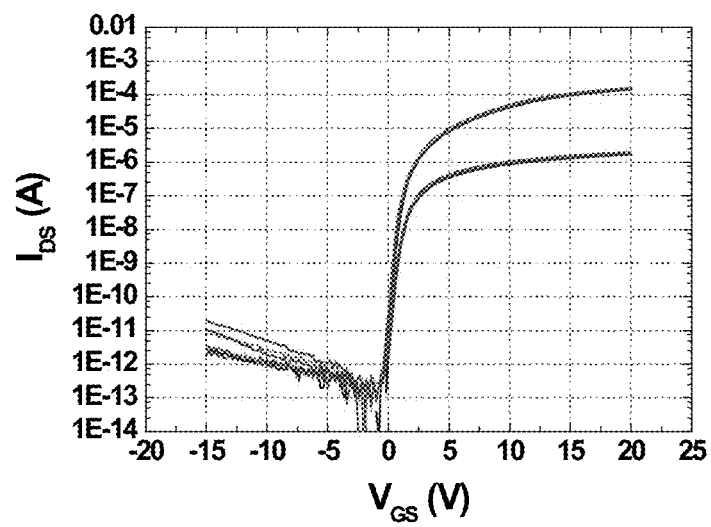
FIGS. 11A and 11B are graphs illustrating $I_{Ds}$-$V_{Gs}$ characteristics when thin-film transistors respectively include a single gate and asymmetrical dual gates, which have the same channel length.

The following experiment was performed using the asymmetrical dual channel structure according to the second embodiment described above. In FIGS. 11A and 12A, the width and length of the thin-film transistor were 4 μm and 12 μm, and in FIGS. 11B and 12B, the width and length of the thin-film transistor were 4 μm and 9 μm+3 μm. In FIGS. 11A to 12B, consequently, the total channel length was equally 12 μm.

Figure 11B:
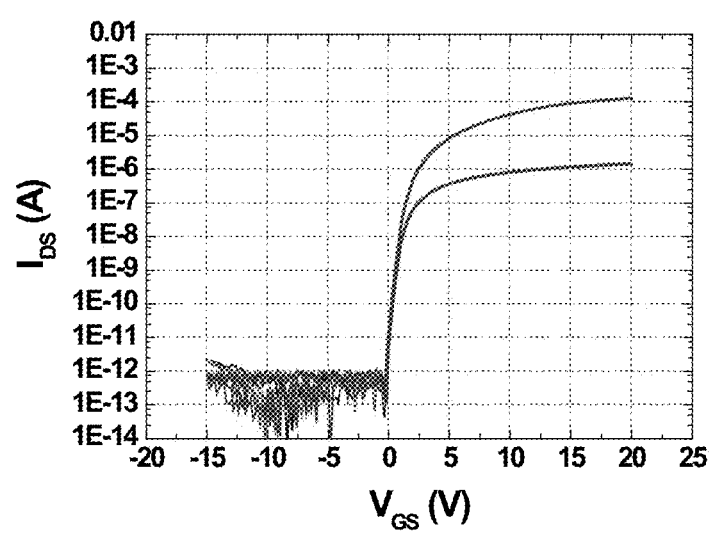
Figure 12A:
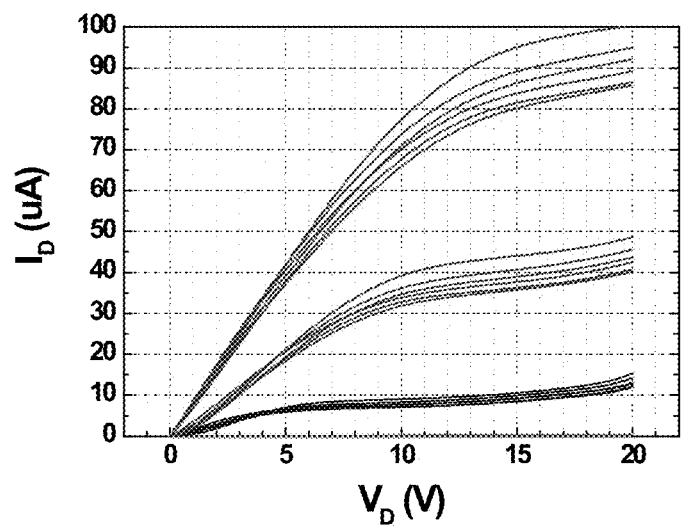
FIGS. 12A and 12B are graphs illustrating $I_D$-$V_D$ characteristics when thin-film transistors respectively include a single gate and asymmetrical dual gates, which have the same channel length.

FIGS. 11A and 11B are graphs illustrating $I_{Ds}$-$V_{Gs}$ characteristics when thin-film transistors respectively include a single gate and asymmetrical dual gates, which have the same channel length.

In FIG. 11A, the width and length of the thin-film transistor were 4 μm and 12 μm respectively. In FIG. 11B, the width and length of the thin-film transistor were 4 μm and 9 μm+3 μm respectively, and the thin-film transistor has the asymmetrical dual channel structure according to the second embodiment described above. In FIGS. 11A and 11B, consequently, the total channel length was equally 12 μm.

It can be verified by comparing the graphs of FIGS. 11A and 11B with each other that current-off characteristics were improved when the structure of FIG. 11B, e.g., the asymmetrical dual channel structure is applied. That is, it can be verified that the driving thin-film transistor of the present invention is advantageous for use in a high resolution device, compared to that having a general single gate structure, and also achieves improved current-off characteristics.

Figure 12B:
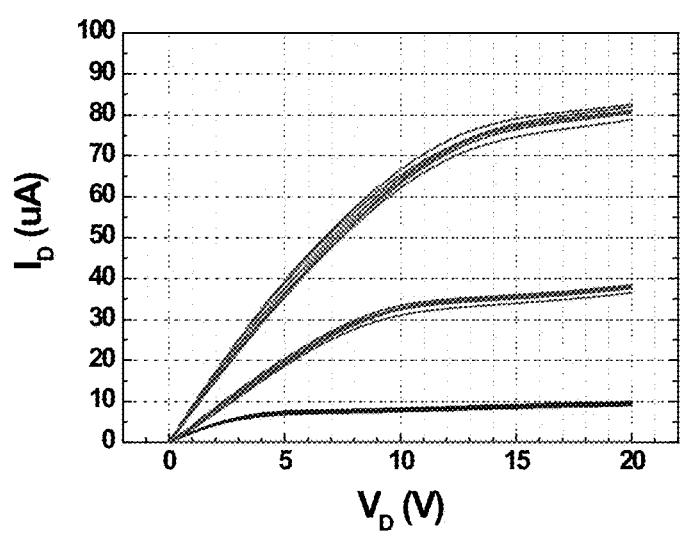

FIGS. 12A and 12B are graphs illustrating $I_D$-$V_D$ characteristics when thin-film transistors respectively include a single gate and asymmetrical dual gates, which have the same channel length.

It can be verified by comparing the graphs of FIGS. 12A and 12B with each other that current characteristics based on the relationship of $I_D$ and $V_D$ were further stabilized when the structure of FIG. 12B, e.g., the asymmetrical dual channel structure was applied. That is, it can be verified that the driving thin-film transistor of the present invention, which is directly connected to a first electrode (anode) of an organic light-emitting diode, which requires the application of stable driving current $I_D$ thereto for driving, is advantageous for use in a high resolution device, compared to a general single gate structure, and also achieves stabilized driving current characteristics.

Organic Light-Emitting Display Device

Figure 13:
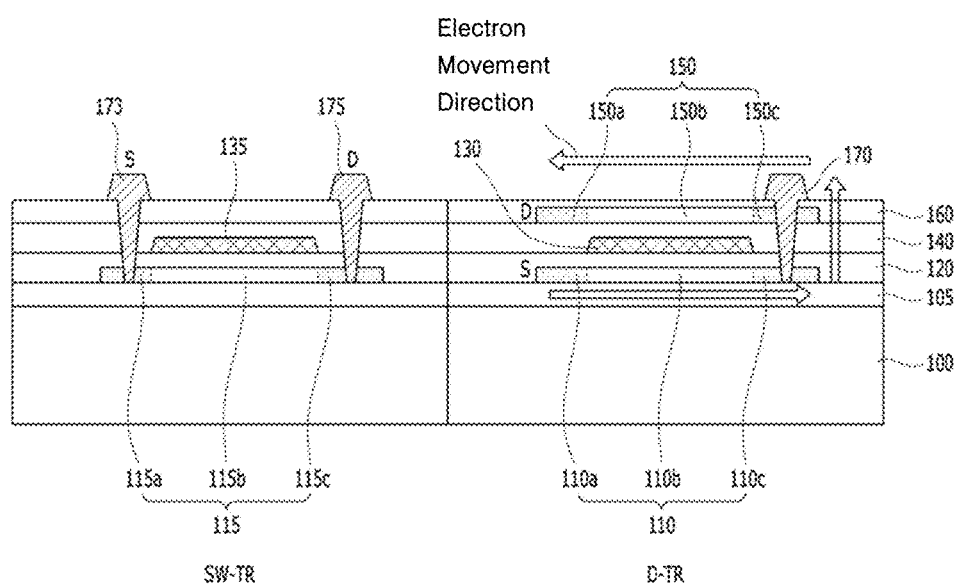
FIG. 13 is a cross-sectional view illustrating a switching thin-film transistor and a driving thin-film transistor used in an organic light-emitting display device according to an embodiment of the present invention.
Figure 14:
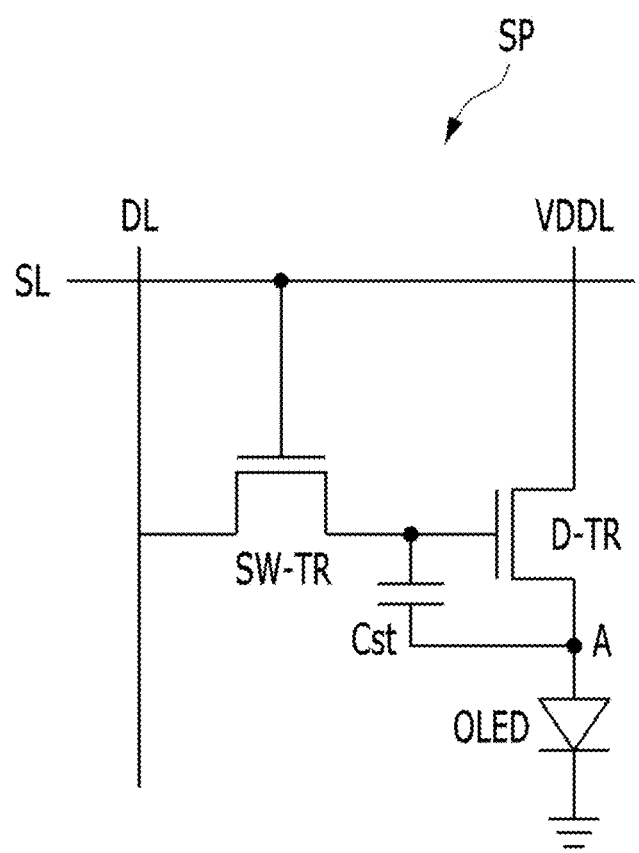
FIG. 14 is an equivalent circuit diagram of one sub-pixel in the organic light-emitting display device according to an embodiment of the present invention.

FIG. 13 is a cross-sectional view illustrating a switching thin-film transistor and a driving thin-film transistor used in an organic light-emitting display device of the present invention, and FIG. 14 is an equivalent circuit diagram of one sub-pixel in the organic light-emitting display device of the present invention.

As illustrated in FIGS. 13 and 14, the organic light-emitting display device of the present invention includes a substrate 100 having a plurality of sub-pixels SP (only one sub-pixel being illustrated in FIG. 13), and a driving thin-film transistor D-TR, a switching thin-film transistor SW-TR and an organic light-emitting diode OLED, which are provided in each sub-pixel. The driving thin-film transistor D-TR includes the first active layer 110 and the second active layer 150, which are located in different layers over the substrate 100 to overlap each other and respectively have protruding portions at different positions, the first gate electrode 130 located between the first and second active layers 110 and 150, a first source electrode (see reference numeral 270 in FIG. 2) connected to the protruding portion (more particularly, an extension from the source area) of the first active layer 110, and a first drain electrode (see reference numeral 290 in FIG. 2) connected to the protruding portion (more particularly, an extension from the drain area) of the second active layer 150. The switching thin-film transistor SW-TR is connected to the driving thin-film transistor D-TR in the same sub-pixel, and includes a second gate electrode 135 located in the same layer as the first gate electrode 130, a second source electrode 173 and a second drain electrode 175 located in the same layer as the first source electrode and the second drain electrode, and a third active layer 115 located in the same layer as any one of the first active layer 110 and the second active layer 150. The organic light-emitting diode is connected to the first source electrode or the first drain electrode at a first node A.

Here, the driving thin-film transistor D-TR has the structure described above with reference to FIGS. 1 to 12B. Any one structure of the first embodiment or the second embodiment described above may be applied thereto.

In addition, although FIG. 13 illustrates an example in which the third active layer 115 of the switching thin-film transistor SW-TR is provided under the second gate electrode 135, the disclosure is not limited thereto and the third active layer 115 may be provided above the second gate electrode 135.

The organic light-emitting diode may basically include a first electrode (anode), an organic emission layer, and a second electrode (cathode), and may further include common layers between the organic emission layer and the first electrode and between the organic emission layer and the second electrode, these common layers being formed by depositing an organic material. The organic light-emitting diode operates upon receiving driving current when the first electrode is connected to the driving thin-film transistor D-TR at the first node A. The second electrode may be formed throughout the sub-pixel, and may be grounded as illustrated, or may receive a constant voltage, in order to maintain the same potential.

Specifically, considering the circuit configuration of each sub-pixel with reference to FIG. 14, the sub-pixel SP is defined by a scan line SL and a data line DL, which cross each other. In addition, in a display area AA, a driving voltage line VDDL is further provided in the same direction as the data line DL, and a driving voltage is applied to the driving voltage line VDDL to drive the circuit provided in each sub-pixel SP. The driving voltage line VDDL is connected to the driving thin-film transistor.

In the circuit configuration, the switching thin-film transistor SW-TR is provided at the intersection of the scan line SL and the data line DL, the driving thin-film transistor D-TR is provided between the switching thin-film transistor SW-TR and the driving voltage line VDDL, the organic light-emitting diode OLED is connected to the driving thin-film transistor D-TR, and a storage capacitor Cst is provided between a first gate electrode and the first drain electrode (or the first source electrode) of the driving thin-film transistor D-TR.

Here, the switching thin-film transistor SW-TR is formed at the intersection of the scan line SL and the data line DL and functions to select the corresponding sub-pixel. In addition, the driving thin-film transistor D-TR functions to drive the organic light-emitting diode OLED of the sub-pixel selected by the switching thin-film transistor SW-TR.

The switching thin-film transistor SW-TR may maintain a short channel for fast switching, and thus may have a single channel, rather than having double channels, even in a high-resolution structure.

FIG. 14 illustrates a 2T1C structure provided in the sub-pixel, and in some situations, transistors and capacitors may be added thereto. In the organic light-emitting display device of the present invention, only the driving thin-film transistor D-TR may have a dual channel structure illustrated in the right side of FIG. 13, and other transistors including the switching thin-film transistor SW-TR may have a single channel structure. In addition, the storage capacitor may use the region in which the doped area of the active layer and the electrode overlap each other, and no region for the storage capacitor may be added, which is advantageous for a high-resolution organic light-emitting display device.

As is apparent from the above description, a driving thin-film transistor and an organic light-emitting display device using the same have the following effects.

First, in the organic light-emitting display device of the present invention, the driving thin-film transistor has a stack structure different from that of a switching thin-film transistor. In particular, the driving thin-film transistor includes stack-type active layers and achieves an increased channel length via a change in the vertical structure thereof without increasing the planar area thereof, thus being advantageously applied to a high-resolution small sub-pixel.

Second, by providing the driving thin-film transistor with double active layers, the kink effect may be reduced and the uniformity of drain current supplied from the driving thin-film transistor to an organic light-emitting diode may be secured.

Third, the long channel of the driving thin-film transistor may increase the linear section of the I-V curve, and thus may provide a sufficient gradation variation section. Thereby, the driving thin-film transistor is suitable for gradation of the organic light-emitting diode.

Although the embodiments of the present invention have been described above in detail with reference to the accompanying drawings, it will be apparent to those skilled in the art that the present invention described above is not limited to the embodiments described above, and various substitutions, modifications, and alterations may be devised within the spirit and scope of the present invention.

What is claimed is:
1. A driving thin-film transistor comprising:
a substrate;
a first active layer disposed on the substrate and including a first protruding portion;
a second active layer overlapping with the first active layer and including a second protruding portion;
a gate electrode disposed between the first active layer and the second active layer;
a source electrode connected to the first protruding portion of the first active layer; and
a drain electrode connected to the second protruding portion of the second active layer,
wherein the first protruding portion of the first active layer and the second protruding portion of the second active layer are located at different positions.
2. The transistor according to claim 1, wherein the first protruding portion of the first active layer does not overlap with the second protruding portion of the second active layer.
3. The transistor according to claim 1, further comprising:
a connection electrode overlapping with the first active layer and the second active layer,
wherein the connection electrode penetrates the first and second active layers and is laterally connected to the first and second active layers.
4. The transistor according to claim 3, wherein the connection electrode is laterally connected to a first doped area of the first active layer, and
wherein the connection electrode is laterally connected to a second doped area of the second active layer.
5. The transistor according to claim 4, wherein first doped area of the first active layer and the second doped area of the second active layer are doped with a same dopant.
6. The transistor according to claim 1, further comprising:
a first gate insulation layer disposed between the first active layer and the gate electrode; and
a second gate insulation layer disposed between the gate electrode and the second active layer.
7. The transistor according to claim 6, wherein the first active layer and the second active layer include a first channel and a second channel, respectively, and
wherein transistor is configured to sequentially move electrons through the source electrode, the first protruding portion of the first active layer, the first channel of the first active layer, the connection electrode, the second channel of the second active layer, the second protruding portion of the second active layer and the drain electrode.
8. The transistor according to claim 1, wherein the gate electrode does not overlap with the first and second protruding portions of the first and second active layers.
9. The transistor according to claim 8, wherein the first protruding portion of the first active layer is a doped area, and
wherein the second protruding portion of the second active layer is a doped area.
10. The transistor according to claim 1, wherein the gate electrode overlaps with the first active layer and the second active layer at different regions, and
wherein the first active layer does not overlap with the second active layer.
11. The transistor according to claim 10, wherein a first area of the gate electrode is overlapping with the first active layer,
wherein a second area of the gate electrode is overlapping with the second active layer, and wherein the first area of the gate electrode is a different size than the second area of the gate electrode.

12. The transistor according to claim 1, wherein the first active layer, the gate electrode and the second active layer overlap each other in a same region.

13. The transistor according to claim 1, wherein the first channel of the first active layer is a different length than the second channel of the second active layer.

14. The transistor according to claim 1, wherein the first channel of the first active layer and the second channel of the second active layer have a same area.

15. An organic light-emitting display device comprising:
a substrate including a plurality of sub-pixels;
a driving thin-film transistor disposed in each sub-pixel among the plurality of sub-pixels and including:
a first active layer disposed on the substrate and including a first protruding portion,
a second active layer overlapping with the first active layer and including a second protruding portion located at a different position than the first protruding portion,
a first gate electrode disposed between the first active layer and the second active layer,
a source electrode connected to the first protruding portion of the first active layer, and
a drain electrode connected to the second protruding portion of the second active layer;
a switching thin-film transistor connected to the driving thin-film transistor in each sub-pixel among the plurality of sub-pixels and including:
a second gate electrode in the same layer as the first gate electrode,
a second source electrode and a second drain electrode in the same layer as the first source electrode of the driving thin-film transistor and the first drain electrode of the driving thin-film transistor, and
a third active layer in the same layer as the first active layer of the driving thin-film transistor or the second active layer of the driving thin-film transistor; and
an organic light-emitting diode connected to the first source electrode or the first drain electrode.

16. The organic light-emitting display device according to claim 15, further comprising:
a connection electrode overlapping with the first active layer and the second active layer,
wherein the connection electrode penetrates the first and second active layers and is laterally connected to the first and second active layers.

17. The organic light-emitting display device according to claim 16, wherein the connection electrode is laterally connected to a first doped area of the first active layer, and
wherein the connection electrode is laterally connected to a second doped area of the second active layer.

18. The organic light-emitting display device according to claim 15, wherein the first gate electrode does not overlap with the first and second protruding portions of the first and second active layers.

19. The organic light-emitting display device according to claim 15, wherein the first gate electrode overlaps with the first active layer and the second active layer at different regions, and
wherein the first active layer does not overlap with the second active layer.

20. The organic light-emitting display device according to claim 15, wherein the first active layer, the first gate electrode and the second active layer overlap each other in a same region.

* * * * *